United States Patent
Tada

[11] Patent Number: 5,966,061
[45] Date of Patent: *Oct. 12, 1999

[54] SAW FILTER WITH SUCCESSIVELY GROUNDED ELECTRODE FINGERS

[75] Inventor: Yutaka Tada, Osaka, Japan

[73] Assignee: Murata Manufacturing Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/745,896

[22] Filed: Nov. 7, 1996

Related U.S. Application Data

[63] Continuation of application No. 08/414,755, Mar. 31, 1995, abandoned.

[30] Foreign Application Priority Data

Apr. 12, 1994 [JP] Japan ..................... 6-073091

[51] Int. Cl.⁶ ..................................... H03H 9/64
[52] U.S. Cl. ..................... 333/195; 310/313 D
[58] Field of Search ................. 333/193–196; 310/313 R–313 D

[56] References Cited

U.S. PATENT DOCUMENTS

| | | | |
|---|---|---|---|
| 4,492,940 | 1/1985 | Hikita | 333/195 |
| 4,672,339 | 6/1987 | Zibis | 333/194 |
| 5,243,249 | 9/1993 | Miyashita et al. | 310/313 B |
| 5,300,902 | 4/1994 | Satoh et al. | 333/193 |
| 5,304,965 | 4/1994 | Manner | 333/193 |
| 5,309,126 | 5/1994 | Allen | 333/193 |
| 5,313,177 | 5/1994 | Hickernell et al. | 333/195 |
| 5,325,573 | 7/1994 | Miyashita et al. | 333/195 |
| 5,434,466 | 7/1995 | Hickernell et al. | 333/195 |
| 5,568,002 | 10/1996 | Kawakatsu et al. | 310/313 B |

FOREIGN PATENT DOCUMENTS 0 614 272 A1  9/1994  European Pat. Off. ............. 333/195

Primary Examiner—Robert Pascal
Assistant Examiner—Barbara Summons
Attorney, Agent, or Firm—Majestic, Parsons, Siebert & Hsue P.C.

[57] ABSTRACT

A surface acoustic wave filter has an input electrode and an output electrode of a finger type with mutually parallel elongated fingers formed generally at a constant pitch on a piezoelectric substrate and sandwiched between a pair of reflectors. Two of these fingers of the input electrode which are the closest and the second closest to the output electrode, or two of these fingers of the output electrode which are the closest and the second closest to the input electrode, are connected together to a same grounding terminal. A plurality of such filters may be connected together to form a multi-stage filter.

20 Claims, 6 Drawing Sheets

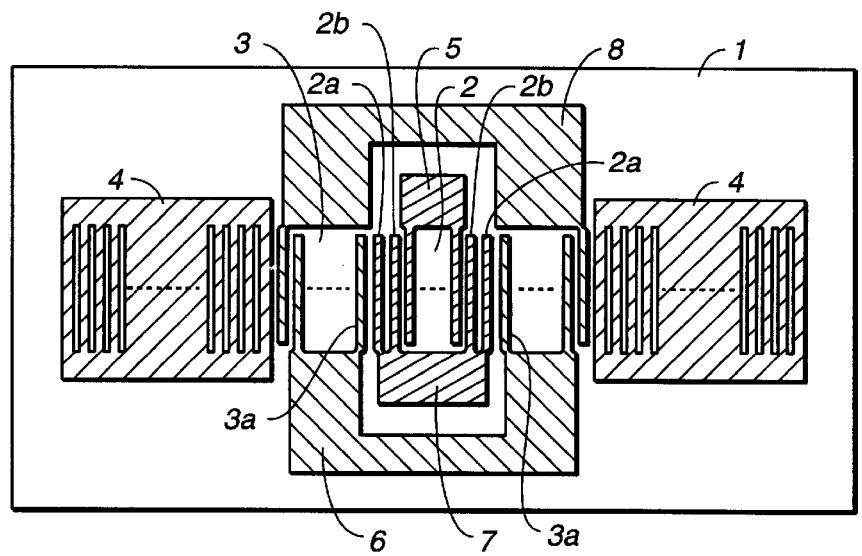
FIG._1A
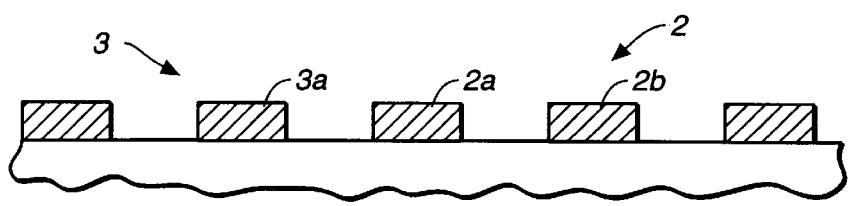
FIG._1B
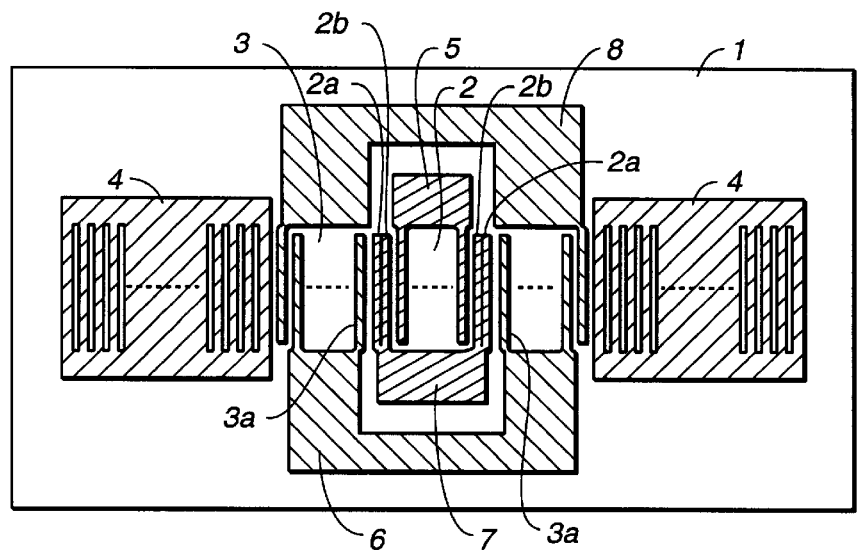
FIG._2A
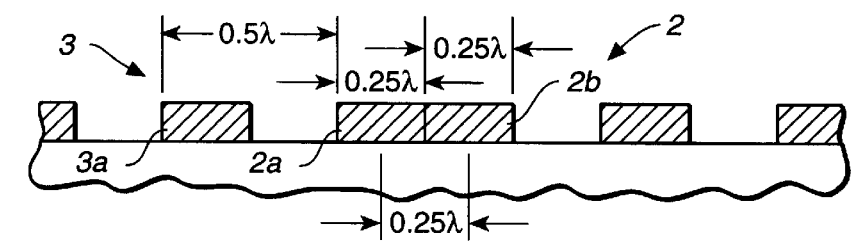
FIG._2B

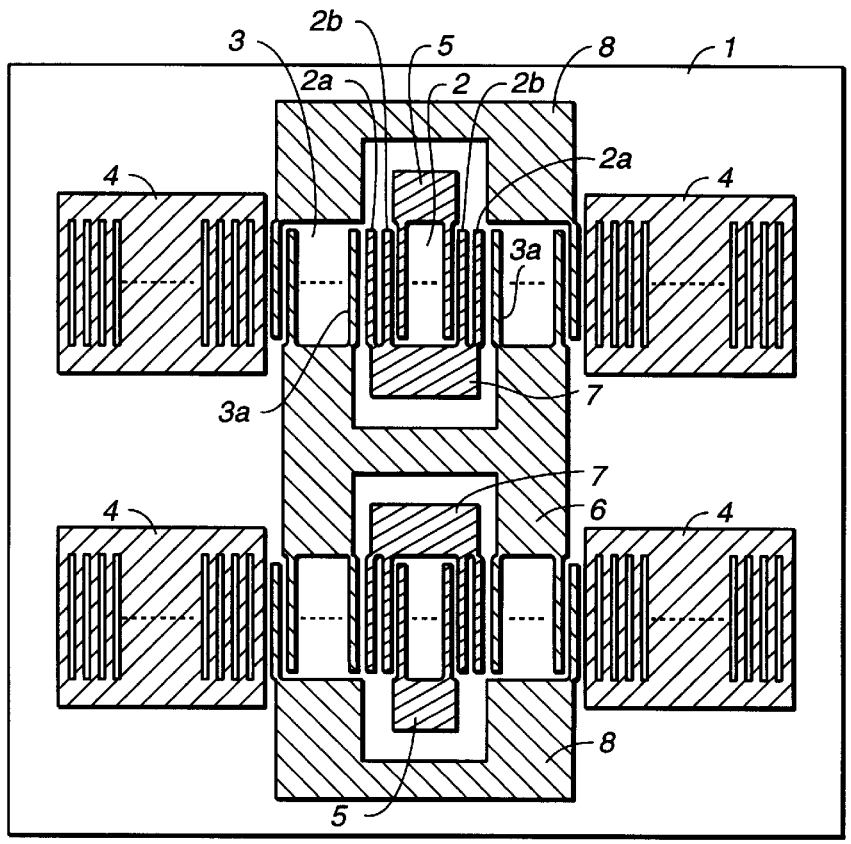
FIG._3
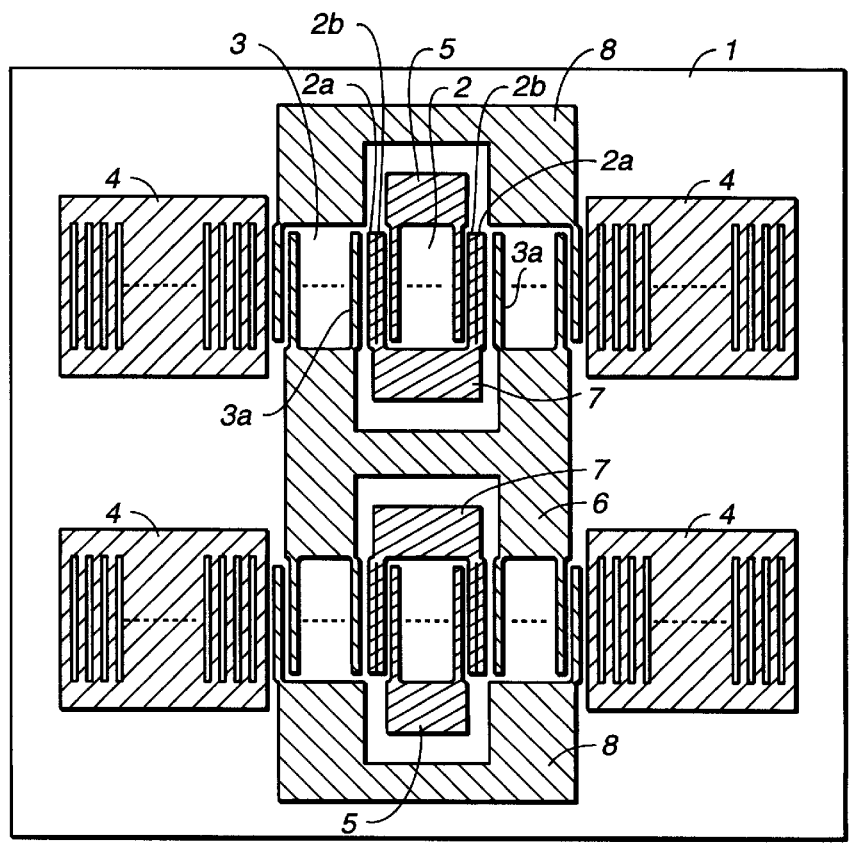
FIG._4

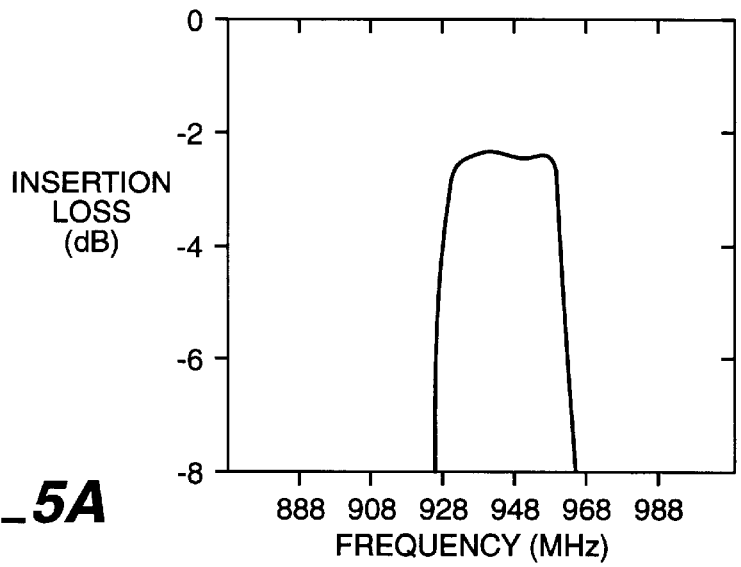
FIG._5A
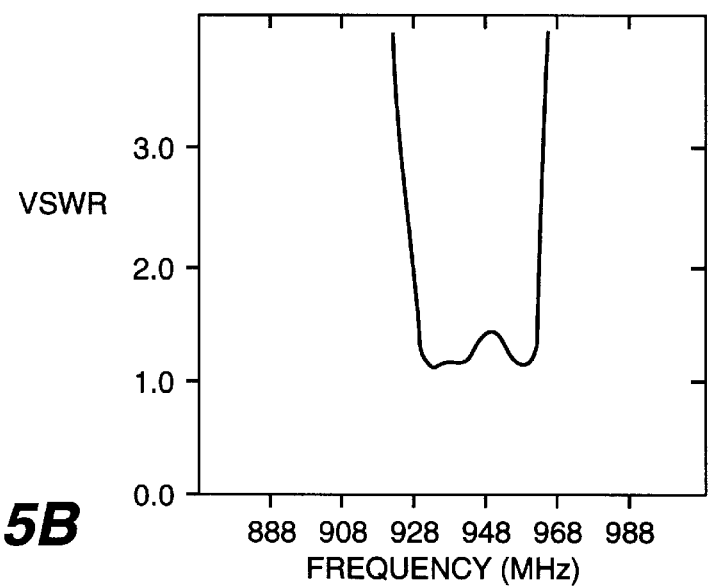
FIG._5B
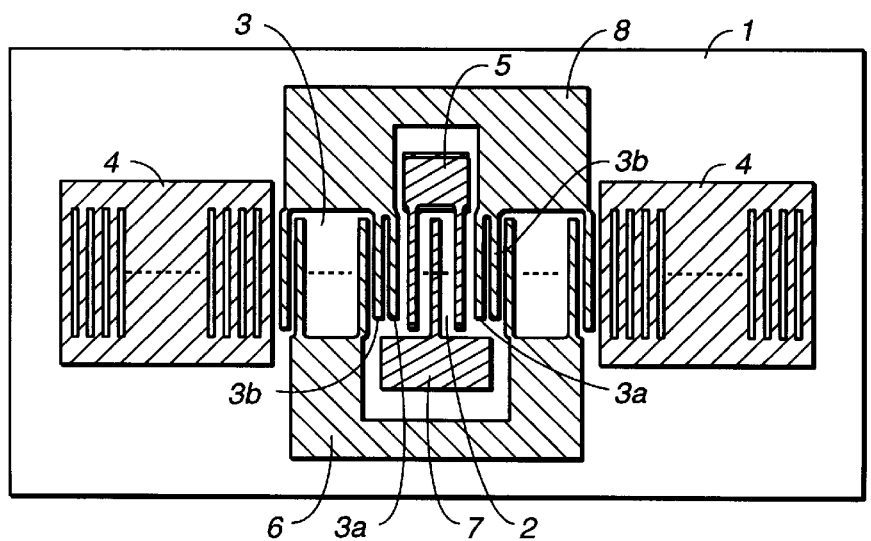
FIG._6

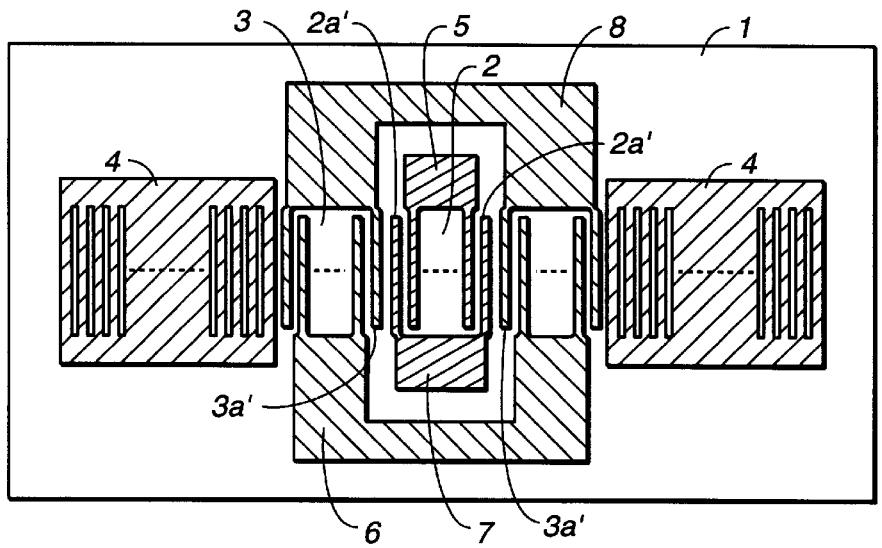
FIG._7
*(PRIOR ART)*
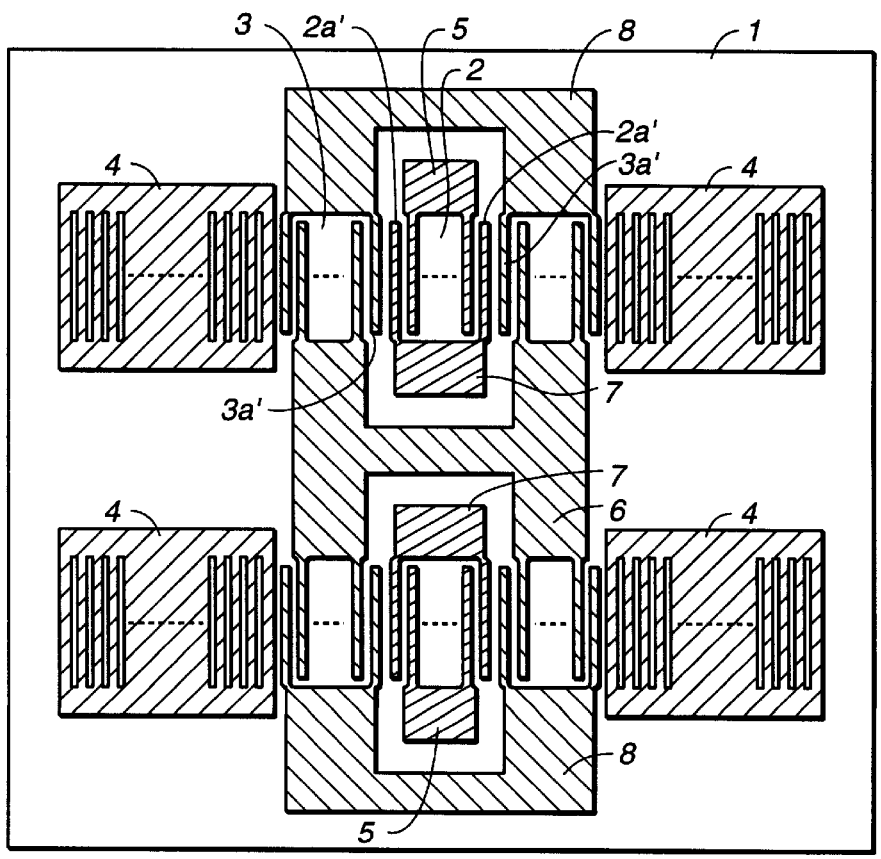
FIG._8
*(PRIOR ART)*

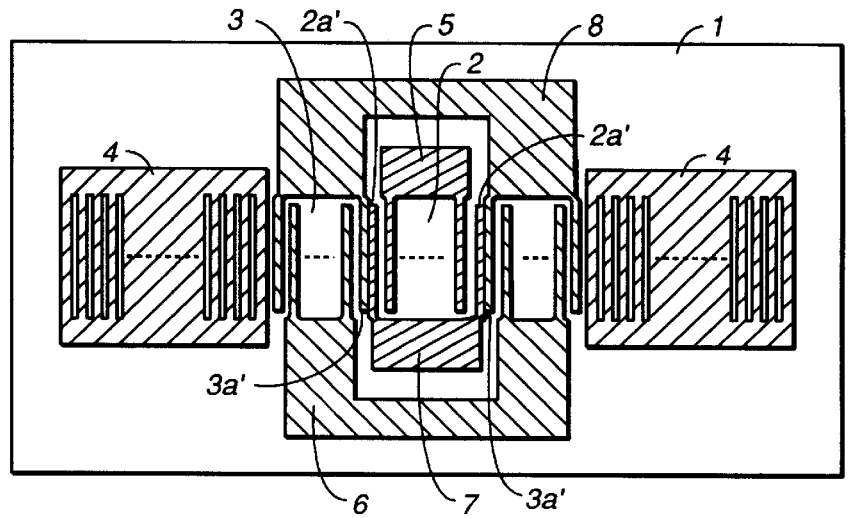
FIG._9A
*(PRIOR ART)*
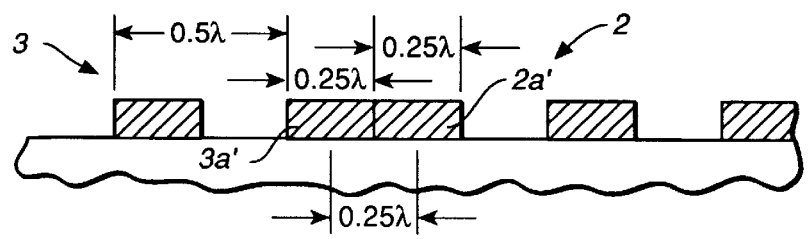
FIG._9B
*(PRIOR ART)*
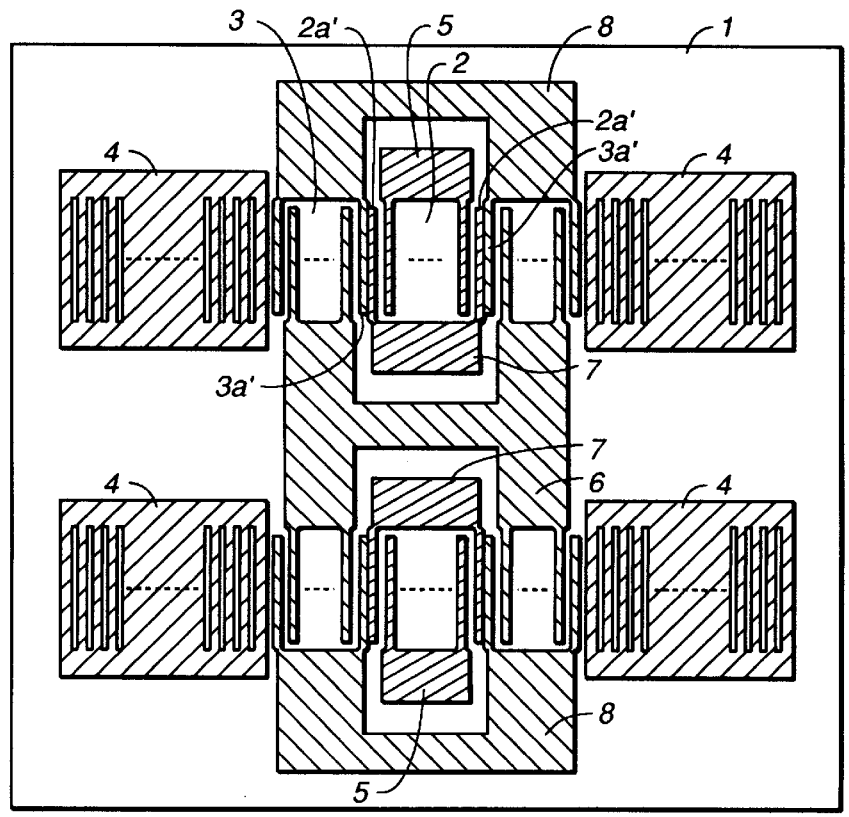
FIG._10
*(PRIOR ART)*

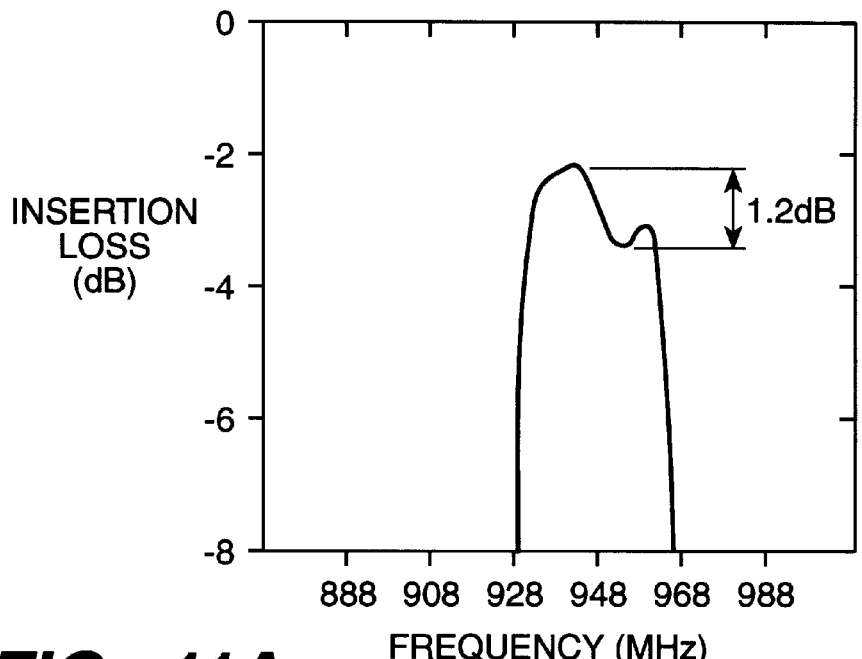
FIG._11A
*(PRIOR ART)*
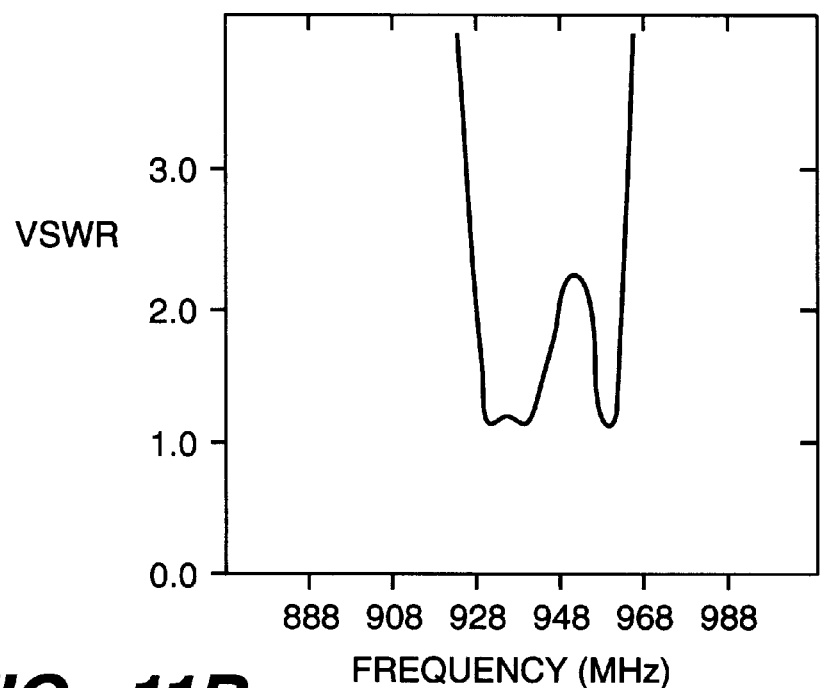
FIG._11B
*(PRIOR ART)*

SAW FILTER WITH SUCCESSIVELY GROUNDED ELECTRODE FINGERS

This is a continuation of application Ser. No. 08/414,755 filed Mar. 31, 1995, now abandoned.

BACKGROUND OF THE INVENTION

This invention relates to a surface acoustic wave (SAW) filter comprising resonators for use in a mobile communication equipment such as a portable telephone.

SAW filters have been in use for portable telephones because they can contribute to providing compact devices requiring no tuning. Among such SAW filters, those comprising resonators are considered to be the simplest in structure and the least costly. FIG. 7 shows an example of such a SAW filter of the single-stage type characterized as having interdigitating finger type (or comb-shaped) input and output electrodes 2 and 3 each having elongated "fingers" (or comb teeth) arranged mutually parallel on a piezoelectric substrate 1 at a constant pitch and sandwiched between reflectors 4 also having parallel fingers (as disclosed, for example, in U.S. Pat. No. 5,300,902). The input electrode 2 has fingers connected to and extending from an input terminal 5 as well as those connected to a grounding terminal 7 and extending therefrom towards the input terminal 5. Likewise, the output electrode 3 has fingers connected to and extending from an output terminal 6 and those connected to another grounding terminal 8 and extending therefrom towards the output terminal 6. The input electrode 2 is surrounded as a whole by the output electrode 3 such that the input terminal 5 is surrounded from three sides by the grounding terminal 8 of the output electrode 3 and the grounding terminal 7 of the input electrode 2 is surrounded from three sides by the output terminal 6. The outermost fingers 2a' of the input electrode 2 which are the closest to the output electrode 3 are connected to its grounding terminal 7 and extend therefrom towards the input terminal 5, and the innermost fingers 3a' of the output electrode 3 which are the closest to the input electrode 2 are connected to its grounding terminal 8 and extend therefrom towards the output terminal 6.

FIG. 8, wherein components which are substantially equivalent to those shown in FIG. 7 are indicated by the same numerals, shows another prior art filter with two stages, as an example, formed by connecting a plurality of single-stage type SAW filters described above with reference to FIG. 7. SAW filters of a two-stage (or multi-stage) type have the advantage that they can provide a higher level of attenuation required when used, for example, in a portable telephone.

For expanding the pass band of a SAW filter of this type, it has also been known to use a 36° rotation Y cut X propagation (Y-X) LiTaO$_3$ substrate or a 64° Y-X LiNbO$_3$ substrate as its piezoelectric substrate and to arrange the fingers as shown in FIGS. 9A, 9B and 10, that is, each finger is of width equal to 0.25λ (where λ is the wavelength of the surface acoustic wave generated by the filter) and mutually adjacent pairs of fingers are separated by the same distance (=0.25λ) such that the distance between the center lines of mutually adjacent pairs of them is equal to 0.5λ, except between the outermost fingers 2a' of the input electrode 2 and the innermost fingers 3a' of the output electrode 3 are in contact with each other, as better shown in FIG. 9B. Passband characteristics of such a filter (with the outermost fingers 2a' of the input electrode 2 and the innermost fingers 3a' of the output electrode 3 disposed next to and in contact with each other in a side-by-side relationship) are generally as shown in FIGS. 11A and 11B. (They naturally depend on the material of the piezoelectric substrate 1 and the structures of the finger (or comb) type input and output electrodes 2 and 3.) FIGS. 11A and 11B show the insertion loss and the voltage standing-wave ratio (VSWR) of a two-stage SAW filter as shown in FIG. 10, of which specifications are given in Table 1 below.

TABLE 1

| | |
|---|---|
| Piezoelectric substrate: substrate | 36° Y—X LiTaO$_3$ |
| Thickness of electrode film: | 2700Å |
| Electrode material: | Aluminum |
| Number of fingers for reflectors: reflector | 200 for each |
| Number of fingers for input electrode 2: | 41 |
| Number of fingers for output electrode 3: | 27 each |
| Center-to-center distance between adjacent pairs of fingers of input and output electrodes: | 2.1 μm |
| Length of the fingers by which fingers extending from opposite directions overlap each other: | 170 μm |
| Center-to-center distance between the fingers 2a' and and 3a': | 0.25λ |
| Number of filter stages: | 2 |

FIGS. 11A and 11B show not only that there is a ripple of about 1.2 dB inside the passband but also that the VSWR inside the passband becomes as large as 2.2. For practical applications of SAW filters of the type under consideration, however, it is generally required that the ripples be less than 1.0 dB and the VSWR be less than 2.0. In order to satisfy these requirements, it is necessary to design a filter such that its passband will be narrower. With such a design, it is difficult to provide a SAW filter with a broad passband for a large variety of uses.

SUMMARY OF THE INVENTION

It is therefore an object of this invention in view of the above to provide a SAW filter with which the ripples and the VSWR inside the passband are reduced and which, hence, are adapted for a large variety of uses.

A SAW filter according to this invention, with which the above and other objects can be accomplished, may be characterized not only as having finger type input and output electrodes sandwiched between reflectors on a piezoelectric substrate and having the fingers of the input (or output) electrode which are the closest and the second closest to the output (or input) electrode are both connected to the same grounding terminal. A plurality of such single-stage filters may be connected to form a multi-stage SAW filter.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1A is a plan view schematically showing a single-stage SAW filter embodying the invention, and FIG. 1B is a sectional view of a portion thereof to show its finger arrangement;

FIG. 2A is a plan view schematically showing another single-stage SAW filter embodying the invention, and FIG. 2B is a sectional view of a portion thereof to show its finger arrangement;

FIG. 3 is a plan view schematically showing a two-stage SAW filter embodying the invention;

FIG. 4 is a plan view schematically showing another two-stage SAW filter embodying the invention;

FIGS. 5A and 5B are graphs schematically showing passband characteristics of a two-stage SAW filter shown in FIG. 4;

FIG. 6 is a plan view schematically showing still another single-stage SAW filter embodying the invention;

FIG. 7 is a plan view schematically showing a prior art single-stage SAW filter;

FIG. 8 is a plan view schematically showing a prior art two-stage SAW filter;

FIG. 9A is a plan view schematically showing another prior art single-stage SAW filter, and FIG. 9B is a sectional view of a portion thereof to show its finger arrangement;

FIG. 10 is a plan view schematically showing another prior art two-stage SAW filter; and FIGS. 11A and 11B are graphs schematically showing passband characteristics of a prior art two-stage SAW filter shown in FIG. 10.

Throughout herein, those components which are equivalent to each other or substantially identically structured are indicated by the same symbols and not necessarily described repetitiously as they may appear as parts of different filters.

DETAILED DESCRIPTION OF THE INVENTION

FIGS. 1A and 1B show a single-stage SAW filter embodying the invention, using the same numerals as in FIG. 7 for indicating corresponding or comparable components.

The single-stage SAW filter according to this invention shown in FIGS. 1A and 1B comprise a 36° Y-X LiTaO$_3$ substrate serving as a piezoelectric substrate 1, having formed thereon, like the corresponding prior art single-stage SAW filter described above with reference to FIG. 7, an input electrode 2 and an output electrode 3 which are both of a finger type (or comb-shaped) having elongated mutually parallel fingers at a constant pitch, as well as reflectors 4 sandwiching the input and output electrodes 2 and 3 therebetween. Some of the fingers of the input electrode 2 are connected to an input terminal 5 and protrude towards a grounding terminal 7 from which some fingers protrude towards the input terminal 5. Likewise, some of the fingers of the output electrode 3 are connected to an output terminal 6 and extend towards another grounding terminal 8 from which some fingers protrude towards the output terminal 6. The output terminal 6 and the grounding terminal 8 of the output electrode 3 are both generally U-shaped and surround from three sides the grounding terminal 7 of the input electrode 2 and the input terminal 5, respectively.

The single-stage SAW filter of FIG. 1A is different from the prior art single-stage SAW filter of FIG. 7 in that the innermost fingers 3a of the output electrode 3 which are the closest to the input electrode 2 are connected to the output terminal 6 and protrude therefrom towards the grounding terminal 8, and that not only the outermost fingers 2a of the input electrode 2 which are the closest to the output electrode 3 but also the second most outwardly located fingers 2b of the inner electrode 2 (which are the second closest fingers of the input electrode 2 to the output electrode 3) are connected to the grounding terminal 7 and extend therefrom towards the input terminal 5. It may be noted by comparing FIGS. 1A and 7 that the SAW filter of this invention shown in FIG. 1A can be obtained by cutting the innermost fingers 3a' of the output electrode 3 of the prior art SAW filter of FIG. 7 and attaching it to the grounding terminal 7 of the input electrode 2 outside its outermost fingers 2a'.

FIGS. 2A and 2B show another single-stage SAW filter embodying the invention which is similar, in one sense, to the one described above with reference to FIGS. 1A and 1B and, in another sense, to the prior art filter described above with reference to FIGS. 9A and 9B. Explained more in detail, the SAW filter shown in FIGS. 2A and 2B have the innermost fingers 3a of its output electrode 3 connected to the output terminal 6 and protruding therefrom towards the grounding terminal 8 and both the outermost fingers 2a and the second outermost fingers 2b of the input electrode 2 connected to the grounding terminal 7 and extending therefrom towards the input terminal 5. Each finger is of width equal to 0.25λ (where λ is the wavelength of the surface acoustic wave generated by the filter) and mutually adjacent pairs of fingers are separated by the same distance (=0.25λ) such that the distance between their centers is equal to 0.5λ, except the outermost and the second outermost fingers 2a and 2b of the input electrode 2 are in contact with each other, as better shown in FIG. 2B. The contacts between the outermost and the second outermost fingers 2a and 2b of the inner electrode 2 do not have any ill effects because they are both connected to the same grounding terminal 7 and hence at the same potential.

Some of the SAW filters according to this invention are of a so-called multi-stage structure, formed by connecting a plurality of single-stage SAW filters of a type described above with reference to FIGS. 1A and 2A. FIGS. 3 and 4 show two-stage SAW filters embodying the invention, formed by connecting two single-stage SAW filters of FIGS. 1A and 2A, respectively, with a single common output terminal 6 shared therebetween.

FIGS. 5A and 5B show pass-band characteristics of a two-stage SAW filter as shown in FIG. 4 with constituent filter formed according to Table 1. A comparison with the graphs in FIGS. 11A and 11B indicates that ripples are now nearly zero within the passband, and the VSWR inside the passband is much smaller, being about 1.0–1.4. In other words, although it used to be believed that no significant effects would be obtained by disconnecting the innermost electrode fingers 3a' of the output electrode 3 of a prior art SAW filter from the output finger grounding terminal 8 and connecting them to the input finger grounding terminal 7 outside the outermost fingers 2a' of the input electrode 2, the present inventors have discovered that this change brings about significant effects on reducing both ripples and VSWR. This may be because prior art filters could not remove the parasitic reactance components due to various wiring from the resonators and various electrode terminals (or electrode pads), but they can be reduced according to the present invention because the mutually adjacent fingers 2a and 2b are grounded together.

Although the present invention has been described above with reference to only a limited number of examples, these examples are not intended to limit the scope of the invention. Many modifications and variations are believed possible within the scope of the invention. For example, the grounding terminal to which two mutually adjacent fingers are connected at an edge of an electrode need not be that of the input electrode (as shown in FIGS. 1–4), but may be that of the output electrode. An example of a single-stage filter thus structured is illustrated in FIG. 6. Similarly, although not separately illustrated, other filters embodying the present invention can be formed by removing the two outermost fingers 2a and 2b of the input electrodes 2 of the filters shown in FIGS. 2–4 from the ground terminal 7 of the input electrode 2 and re-connecting them to the inner edge of the grounding terminal 8 of the output electrode 3. As another example, furthermore, the piezoelectric substrates to be used need not be a 36° Y-X LiTaO$_3$ substrate but may be a 64° Y-X LiNbO$_3$ substrate. Although only two-stage SAW filters were described as examples of a multi-stage SAW filter according to the invention, it goes without saying that three-stage SAW filters, as well as SAW filters with a larger number of stages, can embody the invention. In summary, all such modifications and variations that may be apparent to a person skilled in the art are intended to be included within the scope of the invention.

What is claimed is:

1. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said output electrode surrounding said input electrode; and reflectors formed on said substrate and sandwiching said input and output electrodes therebetween;

two of said fingers of said output electrode which are respectively the closest and the second closest to and proximate to said input electrode being both connected to said second grounding terminal without contacting said input electrode, the distance between the center lines of each of said fingers other than said two fingers and an adjacent finger adjacent said each finger being substantially equal to 0.5$\lambda$.

2. The surface acoustic wave filter of claim 1 which is one of a plurality of similarly structured single-stage filters that are connected together to form a multi-stage filter.

3. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said fingers of said input and output electrodes each having width substantially equal to 0.25$\lambda$ where $\lambda$ is the wavelength of the surface acoustic wave generated by said filter; and reflectors formed on said substrate and sandwiching said input and output electrodes therebetween;

two of said fingers of said input electrode which are respectively the closest and the second closest to and proximate to said output electrode being both connected to said first grounding terminal without contacting said output electrode, the distance between the center lines of said two fingers of said input electrodes being about 0.25$\lambda$.

4. The surface acoustic wave filter of claim 3 which is one of a plurality of single-stage filters that are connected together to form a multi-stage filter.

5. The surface acoustic wave filter of claim 3 wherein said closest finger of said input electrode is adjacent to one of the fingers of said output electrode.

6. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said fingers of said input and output electrodes each having width substantially equal to 0.25$\lambda$ where $\lambda$ is the wavelength of the surface acoustic wave generated by said filter, said output electrode surrounding said input electrode; and reflectors formed on said substrate and sandwiching said input and output electrodes therebetween;

two of said fingers of said output electrode which are respectively the closest and the second closest to and proximate to said input electrode being both connected to said second grounding terminal without contacting said input electrode.

7. The surface acoustic wave filter of claim 6 which is one of a plurality of similarly structured single-stage filters that are connected together to form a multi-stage filter.

8. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said fingers of said input and output electrodes each having width substantially equal to 0.25λ where λ is the wavelength of the surface acoustic wave generated by said filter; and reflectors formed on said substrate and sandwiching said input and output electrodes therebetween;

two of said fingers of said output electrode which are respectively the closest and the second closest to and proximate to said input electrode being both connected to said second grounding terminal without contacting said input electrode, the distance between the center lines of said two fingers of said output electrodes being about 0.25λ.

9. The surface acoustic wave filter of claim 8 which is one of a plurality of single-stage filters that are connected together to form a multi-stage filter.

10. The surface acoustic wave filter of claim 8 wherein said output electrode is disposed between said reflectors and said input electrode.

11. The surface acoustic wave filter of claim 8 wherein said closest finger of said output electrode is adjacent to one of the fingers of said input electrode.

12. The surface acoustic wave filter of claim 8 wherein said output electrode surrounds said input electrode.

13. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said fingers of said input and output electrodes each having width substantially equal to 0.25 λ where λ is the wavelength of the surface acoustic wave generated by said filter; and reflectors formed on said substrate and sandwiching said input and output electrodes therebetween; said output electrode being disposed between said reflectors and said input electrode;

two of said fingers of said input electrode which are respectively the closest and the second closest to and proximate to said output electrode being both connected to said first grounding terminal without contacting said output electrode.

14. The surface acoustic wave filter of claim 13 wherein said output electrode surrounds said input electrode.

15. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal, said output electrode surrounding said input electrode; and reflectors formed on said substrate and sandwiching said input and output electrodes therebetween; said output electrode being disposed between said reflectors and said input electrode;

two of said fingers of said input electrode which are respectively the closest and the second closest to and proximate to said output electrode being both connected to said first grounding terminal without contacting said output electrode, the distance between the center lines of each of said fingers other than said two fingers and an adjacent finger adjacent said each finger being substantially equal to 0.5λ.

16. The surface acoustic wave filter of claim 15 which is one of a plurality of similarly structured single-stage filters that are connected together to form a multi-stage filter.

17. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal; and reflectors formed on said substrate and sandwiching said input and output electrodes therebetween;

two of said fingers of said input electrode which are respectively the closest and the second closest to and proximate to said output electrode being both connected to said first grounding terminal without contacting said output electrode, the distance between the center lines of each of said fingers other than said two fingers and an adjacent finger adjacent said each finger being substantially equal to 0.5λ, the distance between the center lines of said two fingers of said input electrodes being about 0.25λ.

18. The surface acoustic wave filter of claim 17 which is one of a plurality of similarly structured single-stage filters that are connected together to form a multi-stage filter.

19. A surface acoustic wave filter comprising:

a piezoelectric substrate;

an input electrode and an output electrode of a finger type having mutually parallel fingers formed on said substrate, said input electrode including an input terminal and a first grounding terminal, some of said fingers being attached to said input terminal and extending towards said first grounding terminal and some of said fingers being attached to said first grounding terminal and extending towards said input terminal, said output electrode including an output terminal and a second grounding terminal, some of said fingers being attached to said output terminal and extending towards said second grounding terminal and some of said fingers being attached to said second grounding terminal and extending towards said output terminal; and reflectors formed on said substrate and sandwiching said input and output electrodes therebetween;

two of said fingers of said output electrode which are respectively the closest and the second closest to and proximate to said input electrode being both connected to said second grounding terminal without contacting said input electrode, the distance between the center lines of each of said fingers other than said two fingers and an adjacent finger adjacent said each finger being substantially equal to $0.5\lambda$, the distance between the center lines of said two fingers of said input electrodes being about $0.25\lambda$.

20. The surface acoustic wave filter of claim 19 which is one of a plurality of similarly structured single-stage filters that are connected together to form a multi-stage filter.

* * * * *